United States Patent [19]

Sato et al.

[11] 3,932,250

[45] Jan. 13, 1976

[54] METHOD FOR MANUFACTURING METAL FOIL- OR PLASTIC FILM-OVERLAID LAMINATE

[75] Inventors: Shunichi Sato; Masaharu Kurata; Toshiyuki Takao; Sadao Masaki; Toru Notomi; Morio Gaku; Takehiko Moriya, all of Tokyo, Japan

[73] Assignee: Mitsubishi Gas Chemical Co., Ltd., Tokyo, Japan

[22] Filed: May 30, 1974

[21] Appl. No.: 474,803

[30] Foreign Application Priority Data
May 30, 1973    Japan.................. 48-60544

[52] U.S. Cl. ............... 156/213; 134/42; 156/288; 156/323; 156/344; 428/902
[51] Int. Cl.² .......................................... C09J 5/00
[58] Field of Search ........... 156/306, 285, 182, 286, 156/212, 288, 213, 290, 214, 299, 216, 309, 228, 313, 233, 323, 247, 344, 222, 293, 289, 300, 291; 161/216, 406, DIG. 7; 339/17 R, 17 T, 17 B; 29/625; 174/68.5; 317/101 B; 100/36, 93 P, 38; 134/42

[56] References Cited
UNITED STATES PATENTS

| 1,583,381 | 5/1926 | Zimmerman | 156/286 |
|---|---|---|---|
| 1,785,479 | 12/1930 | Dubilier | 156/213 |
| 2,447,541 | 8/1948 | Sabee et al. | 174/68.5 |
| 2,721,152 | 10/1955 | Hopf et al. | 29/625 |
| 2,861,372 | 11/1958 | Hunt | 156/344 |
| 2,997,170 | 8/1961 | Lowry et al. | 161/216 |
| 3,219,749 | 11/1965 | Schuster et al. | 174/68.5 |
| 3,235,954 | 2/1966 | Fromson | 156/145 |
| 3,400,018 | 9/1968 | Morgan et al. | 156/323 |
| 3,477,900 | 11/1969 | Soukup et al. | 156/332 |
| 3,619,310 | 11/1971 | Clarke | 100/93 P |

FOREIGN PATENTS OR APPLICATIONS

| 222,296 | 10/1958 | Australia | 156/247 |
|---|---|---|---|
| 1,022,167 | 3/1966 | United Kingdom | 156/306 |
| 1,033,521 | 6/1966 | United Kingdom | 161/406 |
| 908,516 | 10/1962 | United Kingdom | 156/306 |

Primary Examiner—Douglas J. Drummond
Assistant Examiner—J. J. Gallagher
Attorney, Agent, or Firm—Armstrong, Nikaido & Wegner

[57] ABSTRACT

A method for manufacturing a metal foil- or plastic film-overlaid laminate which comprises completely covering a cleaned press plate with a cleaned metal foil, a cleaned plastic film or both of them in such a manner that the pressing surface of the press plate comes in intimate contact with the face side of said metal foil or plastic film, partially or completely sealing the resulting covering along at least two edges of the press plate, two of the edges being opposite to each other, applying the covered press plate to one or both sides of a laminating base, subjecting the resulting assembly to a laminating apparatus with heating under pressure, taking the assembly out of the laminating apparatus, and thereafter opening the covering to remove the press plate.

16 Claims, 13 Drawing Figures

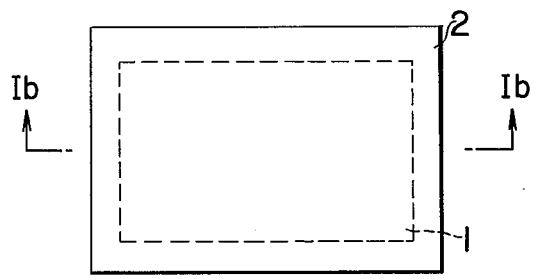
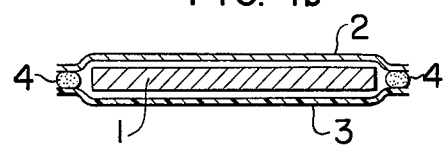
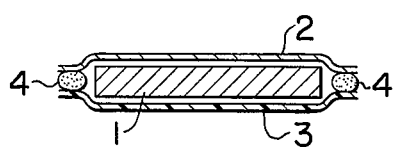
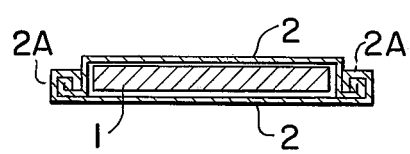
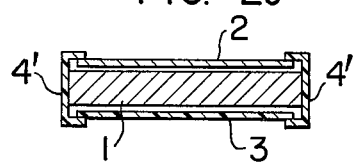

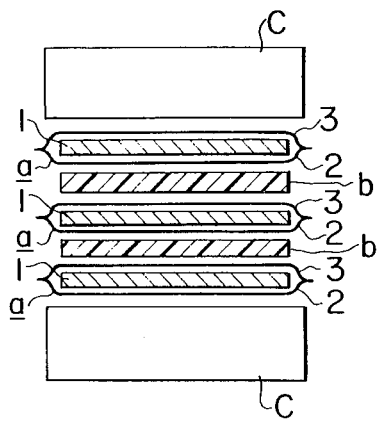
FIG. 3
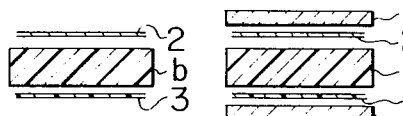 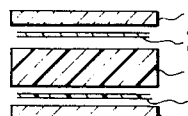 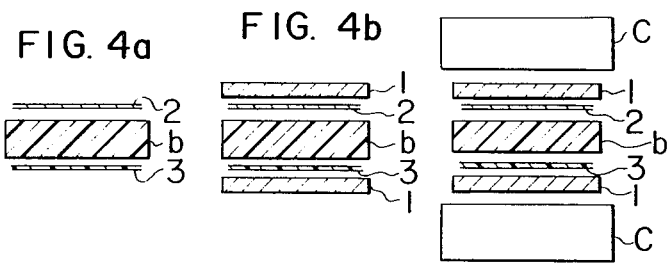
FIG. 4a   FIG. 4b   FIG. 4c
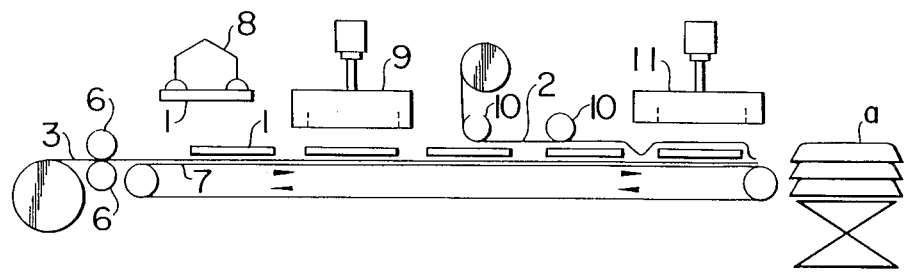
FIG. 5

METHOD FOR MANUFACTURING METAL FOIL- OR PLASTIC FILM-OVERLAID LAMINATE

This invention relates to a method for manufacturing a metal foil- or plastic film-overlaid laminate, for use in printed circuit board, electrical insulation material, and the like.

This invention is concerned with a method for manufacturing the above-mentioned metal foil- or plastic film-overlaid laminate with a smooth and flawless surface of the metal foil or plastic film overlay by keeping dust and other fine particles completely out of access to the interface between the pressing surface of the press plate and the face side of said metal foil or plastic film before lamination is finished, since otherwise these particles tend to cause depressions, which are called dents, on the surface of the metal foil or plastic film layer after lamination.

The metal foil- or plastic film-overlaid laminate has generally been manufactured by the following process:

A cleaned metal foil or plastic film is applied to one or both sides of a laminating base, such as a plastic sheet, a reinforced plastic sheet or a prepreg, in such a manner that the laminating base is in intimate contact with the back side of the metal foil or plastic film. The resulting assembly is then placed between a pair of press plates. In some cases, a plastic film is placed between the press plate and the resulting assembly. After such a preparatory assembling step, laminating is carried out with heating under pressure.

In such a conventional laminating procedure, the press plate, metal foil and plastic film are, of course, cleaned dust-free before use. The dust particles suspended in the surrounding air, the loose fibers from the garments of workers, the dust from machines and apparatus, and dust from the laminating base, and other foreign solid matters may deposit on the surface of press plate or metal foil or plastic film during the assembling step or during transportation of the assembly. On being laminated, these deposited dust particles cause pits and dents on the surface of the metal foil- or plastic film-overlaid laminate. It may be, of course, possible to decrease the occurrence of pits and dents by dust-proofing the working room and working environment, cleaning the garments of workers, installing a dust-catcher for machines and materials, and other appropriate measures, particularly by giving due consideration to handling of the laminating base, press plate, and metal foil or plastic film. However, since it is practically impossible to eliminate dust particles originated from fragments and chips produced from the laminating base itself during assemblage or handling, it has been difficult to manufacture a metal foil- or plastic film-overlaid laminate having flawless surface.

The pits and dents are of various sizes including small ones as well as large ones in accordance with the sizes of dust particles. Those pits and dents of large sizes which are clearly noticeable are detrimental to the commercial value of the product, whilst those of very small sizes which are not easily detectable can escape through the barrier of visual inspection and remain on the commercial product.

As a result of studies conducted on the manufacture of metal foil- or plastic film-overlaid laminate, whose surface is perfectly smooth, and free from even extremely minute pits and dents, the present inventors have found a method for manufacturing a metal foil- or plastic film-overlaid laminate, in which foreign matters such as dust particles generated during the manufacturing step are completely kept from depositing between the press plate and the metal foil or plastic film.

An object of this invention is to provide a method for manufacturing a metal foil- or plastic film-overlaid laminate free from even extremely minute dents.

Another object of this invention is to provide a method for manufacturing a metal foil- or plastic film-overlaid laminate which is suitable for use as a base plate for mounting an IC or a LSI.

Other objects and advantages of this invention will become apparent from the following description.

According to this invention, there is provided a method for manufacturing a metal foil- or plastic film-overlaid laminate, which comprises completely covering a cleaned press plate with at least one member selected from the group consisting of cleaned metal foils and cleaned plastic films in such a manner that the press plate comes in intimate contact with the face side of said member, partially or completely sealing the resulting covering along at least two edges of the press plate, two of said edges being opposite to each other, applying the covered press plate to one or both sides of a laminating base, subjecting the resulting assembly to a laminating apparatus with heating under pressure, taking the assembly out of the laminating apparatus, and thereafter opening the covering to remove the press plate.

The term "metal foil-overlaid laminate" is herein used in the same meaning as "metal-clad laminate". The metal foils may be those which are conventionally used in the production of metal-clad laminates, and include, for example, foils of aluminum, copper, nickel, zinc and alloys of at least two of these metals, copper-aluminum-clad foil, copper-zinc-clad foil, copper-nickel-clad foil, and the like. One or both sides of the metal foil may have been treated chemically or mechanically in a coventional manner. Aluminum and zinc foils may also be used as release films.

The plastic film may be those which are conventionally used in the production of metal-clad laminates and plastic film-overlaid laminates, and include, for example, cellulose acetate, cellulose acetate butyrate, polycarbonate, saturated polyesters, polytetrafluoroethylene, polyethylene terephthalate, polyvinylidene fluoride, fluroinated ethylene-propylene copolymer and the like.

Among these, polytetrafluoroethylene, fluorinated ethylene-propylene copolymer, polyethylene terephthalate and polyvinylidene fluoride are used as release film, and cellulose acetate, cellulose acetete butyrate, polycarbonate and saturated polyesters are used as both release film and overlay. The metal foil and plastic film may preferably have a thickness of 5 to 200 $\mu$.

The laminating base may be those which are conventionally used in the production of laminates, and include, for example, thermosetting resin-impregnated glass fabrics, glass mats, glass papers, glass-cellulose papers, cellulosic papers and synthetic and natural fiber fabrics and sheets of mixtures of a thermosetting resin with glass fiber, inorganic fillers or both of them. The thermosetting resin includes, for example, a phenolic resin, a melamine resin, an epoxy resin, a diallyl phthalate resin, a polyimide, a cyanate resin, an unsaturated polyester and a silicone resin. Further, a thermoplastic sheet may also be used as the laminating base, such as a polyethylene terephthalate sheet, a polyamide-imide sheet, a polyimide sheet, a polycarbonate sheet or a polyphenylene oxide sheet.

Intervention of dust particles and other foreign matters between the press plate and the metal foil or plastic film can be prevented and, hence, occurrence of defects such as pits and dents on the surface of metal foil- or plastic film-overlaid laminate can be prevented by enclosing a cleaned press plate with a cleaned, dust-free metal foil or plastic film in such a manner that the pressing surface of the press plate may come in intimate contact with the face side of said metal foil or film, or alternatively, placing the press plate between a pair of metal foils, a pair of plastic films or a sheet of metal foil and a sheet of plastic film, which are then sealed along at least two edges of the press plate, two of the edges being opposite to each other, preferably around all edges of the press plate by bonding for example, with adhesives or adhesive tapes, caulking, sewing or welding, thus forming the covered press plate, applying the covered press plate to one or both sides of a laminating base, annd subjecting the resulting assembly to a laminating apparatus.

Covering the cleaned, dust-free press plate with a metal foil or plastic film or both of them can be effected automatically under dust-free conditions by using apparatus and technique generally used in packaging of sheet-like articles with a film or in bonding a film or the like to sheet-like articles. It is necessary that the metal foil or plastic film, when used as overlay be brought into intimate contact with the press plate surface without leaving wrinkles, and that along at least two edges more desirably around the edges, of the press plate, the metal foil or plastic film be sealed. Covering the press plate with a metal foil and/or plastic film without leaving wrinkles can be effected by, for example, smoothening the overlay material with a levelling roll, by applying tension to the overlay material by means of clamps holding four edges, or by other means. Sealing along the edges can be conducted by bonding the overlay material to the press plate along the edges, or by bonding, caulking, or welding together the upper and lower overlay materials along the edges of the press plate.

According to this invention, moreover, the step of assembling the laminating base, the metal foil or plastic film, and the press plate can be automated. In the conventional method, as shown in FIG. 4 of the accompanying drawing, generally a metal foil and/or plastic film is placed over a laminating base and then a press plate is placed on the overlay material. Such an assembling step can be automated only with extreme defficulty, because the metal foil and/or plastic film is apt to become wrinkled due to being very thin, requiring manual handling with the utmost care. To the contrary, according to this invention, at first the press plate is covered with the metal foil and/or plastic film, and then the covered press plate is applied to the laminating base, thus eliminating wrinkle-formation during the assembling step and making automation very easy.

The invention is further illustrated below in detail with reference to the accompanying drawings, in which;

FIG. 1a and FIG. 1b show an example of covering a press plate,

FIGS. 2a to 2f represent embodiments of sealing procedure,

FIG. 3 represents an example of assembling in manufacturing a laminate overlaid, on one side, with copper foil according to this invention, FIGS. 4a to 4c are schematic representations of the conventional method, and FIG. 5 is a schematic representation of a method for automatic covering of a press plate.

Figure 2D:
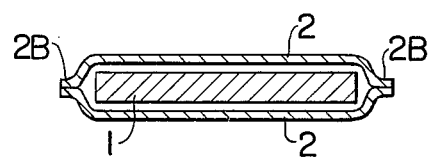
Figure 2E:
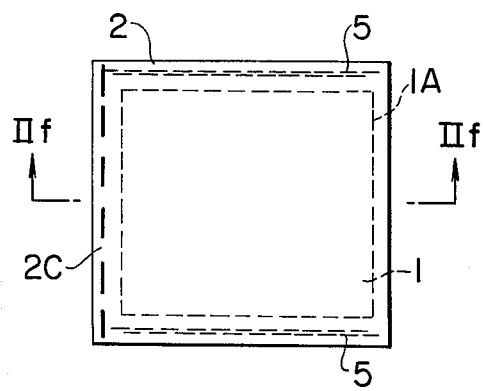
Figure 2F:
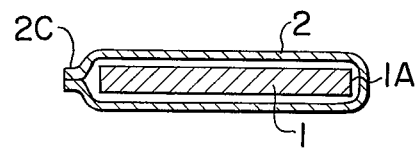

FIG. 1a is a plan view of the press plate covering, and FIG. 1b is a sectional view at 1b—1b in FIG. 1a, wherein 1 is a press plate, 2 is a metal foil (as overlay), 3 is a plastic film (as release film), and 4 is an adhesive layer to serve as a seal. FIGS. 2a to 2f represent various embodiments of the way of sealing after the press plate has been covered with a metal foil, a plastic film or both of them according to this invention. FIG. 2a shows a way of sealing by use of an adhesive, FIG. 2b shows a way of sealing by bending and caulking, and FIG. 2c shows a way of sealing by use of an adhesive tape. FIG. 2a and FIG. 2c show an example of covering with a plastic film (as release film) and a metal foil (as overlay), and FIG. 2b shows an example of covering with a metal foil alone. In FIG. 2a and FIG. 2c, 1 is a press plate, 2 is a metal foil, and 3 is a plastic film. In FIG. 2a, a press plate is placed between a metal foil and a plastic film, both of which are somewhat larger in size than the press plate, and the marginal portions are sealed by use of an adhesive 4. FIG. 2 c shows an example in which a press plate is placed between a metal foil and a plastic film, which is identical in size with the press plate, and the whole is sealed around all the edges by use of an adhesive tape 4'. In FIG. 2b, 1 is a press plate, 2 is a metal foil, 2a shows the bent and caulked portions, and the figure shows an example in which the press plate is covered with a pair of metal foils a little larger in size than the press plate and the marginal portions are sealed along the edges of the press plate by bending and caulking. In FIG. 2d, a press plate 1 is covered with two sheets of metal foil or plastic film 2, and the marginal portions 2b are entirely welded. In FIG. 2f, a press plate 1 is covered with a sheet of metal foil 2, which is folded along the edge 1a and the marginal portions 2c opposite to the folding line are partially welded. FIG. 2e is a plan view of a press plate covering, and FIG. 2f is a sectional view at IIf—IIf in FIG. 2e, wherein 1 is a press plate and 2 is a metal foil. A sheet of metal foil 2 is folded along the edge 1a and the marginal portions 2c opposite to the folding line are partially welded as shown in FIGS. 2e and 2f. The remaining marginal portions of the metal foil are sewed by threads 5 as shown in FIG. 2e.

FIG. 3 shows an example of assembly in manufacturing a laminate ovelaid, on one side, with a copper foil. A press plate 1 is covered, on the upper side, with a glossy aluminum foil 3 used as a release film and, on the other side, with a copper foil 2, which has been roughened on the side to be bonded to the laminating base, the aluminum foil and the copper foil are sealed around the press plate to form a covered press plate a; several of the covered press plates a and several sheets of laminating base b are placed alternately one on the other; and the resulting assembly is pressed with heating by means of a press c.

FIGS. 4a to 4c are a schematic view of a conventional assembling procedure. One side of a laminating base sheet a is covered with a metal foil 2, and the other side thereof with a plastic film (as release film) 3, as shown in FIG. 4a, then interposed between a pair of press plates 1, as shown in FIG. 4b, and the resulting assembly is pressed by means of a press 5, as shown in FIG. 4c. Dust particles and other foreign matters produced during transportation of the laminating base sheet a or in the stage shown in FIG. 4a tend to intrude between the press plate and the metal foil in the stage shown in FIG. 4b and cause surface defects of the finished laminate.

In the method of this invention, as stated above and shown in FIG. 3 as an example, a cleaned press plate is first covered automatically in a dustproof chamber with a metal foil and/or a plastic film, so that there is no chance for the dust particles and other foreign matters to deposit between the press plate and the metal foil or plastic film, unlike the case of the conventional method as shown in FIG. 4a. Consequently, dents and pits on the surface of finished laminates will not occur in the method of this invention even when an assembly of multiple alternate plies of the laminating base sheets and the press plates is subjected to a laminating apparatus.

In FIG. 5 is shown an example of flow diagram of the automatic process for covering a press plate with an overlay metal foil and a release metal foil (aluminum), both foils being a little larger in width than the press plate. A release metal foil (aluminum) 3 from a stock wound on a reel is fed by means of a pair of forwarding rolls 6 onto an automatically operated conveyor belting 7. A press plate 1 is automatically placed on the travelling release metal foil by means of a press plate handling device 8. An adhesive is applied by means of an adhesive coater 9 to the release metal foil along at least two edges of the placed press plate. Another metal foil 2 for use an overlay is fed from a metal foil feeder over the press plate and passes under a leveling roll 10. Both the release metal foil and the overlay metal foil are cut by means of a press-bonding and cutting device 11 to obtain the individual press plate a covered, on one side, with the release metal foil and, on the other side, with the overlay metal foil. Under such operating conditions, dust particles and other foreign matters have no chance to deposit between the press plate and the metal foil for use as overlay. Pairs of the covered press plates and the laminating base sheets are piled so that the overlay metal foil is interposed between each pair to form an assembly, which is then subjected to a laminating apparatus. The covering is thereafter opened to remove the press plate, leaving behind a metal-clad laminate, which has smooth surface without even a minute dent.

What is claimed is:

1. A method for manufacturing a metal foil- or plastic film-overlaid laminate, which comprises completly covering a cleaned press plate with at least one member selected from the group consisting of cleaned metal foils and cleaned plastic films, in such a manner that the pressing surface of the press plate comes in intimate contact with the face side of said member, partially or completely sealing the resulting covering along at least two edges of the press plate, two of the edges being opposite to each other, applying the covered press plate to one or both sides of a laminating base, subjecting the resulting assembly to a laminating apparatus with heating under pressure, taking the assembly out of the laminating apparatus, and thereafter opening the covering to remove the press plate.

2. A method according to claim 1, wherein the covering is sealed with an adhesive, or an adhesive tape.

3. A method according to claim 1, wherein the covering is sealed by bending, caulking, sewing or welding.

4. A method according to claim 1, wherein the metal foils are foils of copper, aluminum, nickel, zinc, and alloys of at least two of these metals, copper-aluminum clad foil, copper-zinc clad foil and copper-nickel clad foil.

5. A method according to claim 4, wherein the metal foils each is treated chemically or mechanically on one or both sides or coated with an adhesive or other metals on one side.

6. A method according to claim 1, wherein the plastic films are films of cellulose acetate, cellulose acetate butyrate, polycarbonate, saturated polyester, polytetrafluoroethylene, polyethylene terephthalate, polyvinylidene fluoride, and fluorinated ethylenepropylene copolymer.

7. A method according to claim 1, wherein the laminating base is a thermosetting resin-impregnated glass fabric, glass mat, glass paper, glass-cellulose paper, cellulosic paper, or synthetic or natural fiber fabric or a sheet of a mixture of a thermosetting resin with glass fiber, an inorganic filler or both thereof.

8. A method according to claim 1, wherein the laminating base is a thermoplastic sheet.

9. A method according to claim 7, wherein the thermosetting resin is a phenolic resin, melamine resin, epoxy resin, diallyl phthalate resin, polyimide, cyanate resin, unsaturated polyester or silicone resin.

10. A method according to claim 7, wherein the laminating base is an epoxy resin-impregnated glass fabric.

11. A method according to claim 8, wherein the thermoplastic sheet is a sheet of polyethylene terephthalate, polyamide-imide, polyimide, polycarbonate, or polyphenylene oxide.

12. A method according to claim 8, wherein the thermoplastic sheet is a polycarbonate sheet.

13. A method according to claim 1, wherein the press plate is covered with a copper foil.

14. A method according to claim 1, wherein the press plate is covered with a cellulose acetate film.

15. A method according to claim 1, wherein the press plate is covered with a copper foil and an aluminum foil 16. A method according to claim 1, wherein the press plate is covered with a copper foil and a cellulose acetate film.

* * * * *